United States Patent
Cheng et al.

(10) Patent No.: US 8,086,923 B2
(45) Date of Patent: Dec. 27, 2011

(54) ACCURATELY IDENTIFYING FAILING SCAN BITS IN COMPRESSION ENVIRONMENTS

(75) Inventors: Wu-Tung Cheng, Lake Oswego, OR (US); Grzegorz Mrugalski, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 131 days.

(21) Appl. No.: 12/265,693

(22) Filed: Nov. 5, 2008

(65) Prior Publication Data

US 2009/0254786 A1    Oct. 8, 2009

Related U.S. Application Data

(60) Provisional application No. 60/985,395, filed on Nov. 5, 2007.

(51) Int. Cl.
 *G01R 31/28* (2006.01)
(52) U.S. Cl. .......................... 714/726; 714/729; 714/732
(58) Field of Classification Search .................... None
 See application file for complete search history.

(56) References Cited

U.S. PATENT DOCUMENTS

| | | | | |
|---|---|---|---|---|
| 6,557,129 | B1* | 4/2003 | Rajski et al. .................. | 714/729 |
| 7,058,869 | B2* | 6/2006 | Abdel-Hafez et al. ........ | 714/729 |
| 7,222,277 | B2* | 5/2007 | Wang et al. ................... | 714/726 |
| 7,376,875 | B2* | 5/2008 | Hilgendorf et al. ........... | 714/734 |
| 7,415,678 | B2* | 8/2008 | Gizdarski ........................ | 716/1 |
| 7,523,370 | B1* | 4/2009 | Keller ............................ | 714/726 |
| 7,729,884 | B2* | 6/2010 | Huang et al. .................. | 702/185 |
| 2003/0229886 | A1* | 12/2003 | Hasegawa et al. ............ | 717/115 |
| 2006/0111873 | A1* | 5/2006 | Huang et al. .................. | 702/185 |
| 2008/0092003 | A1* | 4/2008 | Khoche et al. ................ | 714/733 |
| 2008/0313513 | A1* | 12/2008 | Gizdarski ..................... | 714/729 |

OTHER PUBLICATIONS

Khoche, D. Chindamo, M. Braun, and M. Fischer, "Selective and Accurate Fail Data Capture in Compression Environment for Volume Diagnostics," Proceedings of International Test Conference, Oct. 2006, paper 8.1.

D. Josephson, S. Poehhnan, and V. Govan, "Debug Methodology for the McKinley Processor," Proceedings of International Test Conference, Oct. 30, 2001.

D. Josephson, "The Manic Depression of Microprocessor Debug," Proceedings of International Test Conference, Dec. 2002, pp. 657-663.

C. Pyron, R. Bangalore, D. Belete, J. Goertz, A. Razdan, and D. Younger, "Silicon Symptoms to Solutions: Applying Design for Debug Techniques," Proceedings of International Test Conference, Dec. 2002, pp. 664-672.

Barnhart, V. Brunkhorst, F. Distler, O. Farnsworth, and B. Kellor, "OPMISR: The Foundation of Compressed ATPG Vectors," Proceedings of International Test Conference, Oct. 20, 2001.

J. Rajski, M. Kassab, N. Mukherjee, N. Tamarapalli, J. Tyszer and J. Qian, "Embedded deterministic test for Low-cost manufacturing," IEEE Design and Test of Computers, vol. 20, Issue 5, pp. 58-66, Sep.-Oct. 2003.

(Continued)

*Primary Examiner* — Jeffrey A Gaffin
*Assistant Examiner* — Guerrier Merant (57) ABSTRACT

X-masking registers are added in front of a compactor in test data compression environment to remove unknown values. The X-masking registers block out some chains due to unknown values and select other chains to feed the compactor. This X-masking capability is used to select one scan cell to observe at a time after a failure is observed at the compactor output.

7 Claims, 6 Drawing Sheets

OTHER PUBLICATIONS

P. Wohl, J. A. Waicukauski, S. Patel and M. Amin, "Efficient Compression and Applications of Deterministic Patterns in A Logic BIST Architectures," Proceedings of Design Automation Conference, Jun. 2, 2003, pp. 566-569.

J. Rajski, J. Tyszer, G. Mrugalski, W.-T. Cheng, N. Mukherjee, and M. Kassab, "X-Press Compactor for 1000x Reduction of Test Data," Proceedings of International Test Conference, Oct. 2006, pp. 1-10.

Vallett, and J. Soden, "Finding Fault with Deep Sub-Micrometer ICs," IEEE Spectrum, Oct. 1997.

W. Huott, M. Mcmanus, D. Knebel, S. Steen, D. Manzer, P. Sanda, S. Wilson, Y. Chan, A. Pelella and S. Polonsky, "The Attack of the 'Holey Shmoos': A Case Study of Advanced DFD and Picosecond Imaging Circuit Analysis (PICA)," Proceedings of International Test Conference, Sep. 28, 1999.

S. Mitra and K. Kim, "X-Compact: An Efficient Response Compaction Technique for Test Cost Reduction," Proceedings of International Test Conference, Oct. 7, 2002.

J. H. Patel, S. S. Lumetta, S. M. Reddy, "Application of Saluja-Karpovsky compactors to test responses with many unknowns," Proceedings of VLSI Test Symposium, Apr. 27, 2003, pp. 107-112.

J. Rajski, J. Tyszer, C. Tang and S.M. Reddy, "Convolutional Compaction of Test Responses," Proceedings of International Test Conference, Sep. 30, 2003.

P. Wohl, J. A. Waicukauski, and S. Ramnath, "Fully X-tolerant Combinational Scan Compression," International Test Conference, Oct. 21, 2007, paper 6.1.

\* cited by examiner

--Prior Art--

ACCURATELY IDENTIFYING FAILING SCAN BITS IN COMPRESSION ENVIRONMENTS

RELATED APPLICATIONS

This application claims priority under 35 U.S.C. §119 to U.S. Provisional Patent Application No. 60/985,395, entitled "Accurately Identifying Failing Scan Bits in Compression Environments," filed on Nov. 5, 2007 and naming Grzegorz Mrugalski and Wu-Tung Cheng as inventors, which application is incorporated entirely herein by reference.

FIELD OF THE INVENTION

The present invention is directed to methods, devices and systems for testing integrated circuits. More particularly various embodiment of the present invention are directed to testing integrated circuits in compression environments.

BACKGROUND OF THE INVENTION

Due to the complexity of current circuit designs, the success of first silicon is trending to less than 50%. More designs rely on silicon debug to catch design errors. To enhance the debug capabilities of large circuits, it is desirable to observe internal signals. Scan chains have been used successfully not only for manufacturing test but also for silicon debug. With traditional scan designs, accessing scan cell values is quite straightforward. Nowadays, to reduce the volume of test data and test time, test compression is commonly used. Many test compaction schemes have been shown to significantly reduce test data volume and test application time without losing test quality. Nonetheless, conventional debug techniques still rely heavily on knowing which scan cells capture failing data so that failure analysis equipment can be used to trace failing signals back to defect locations. In this disclosure, the term "failing scan bits" is used to refer to scan cells having incorrect data right before the unloading of the scan chain data. Due to the cost of failure analysis equipment used for debugging, it is desirable to precisely identify failing scan bits.

Several existing techniques can be used to identify failing scan bits in designs with test compression hardware. A first approach is an algorithmic approach. Commercially available compactors are information lossy. However, according to coding theory, a compactor can identify failing scan bits as long as the number of failing scan bits is less than half of its Hamming distance. Some popular compactors, for example, use a Hamming distance of 3, such as the X-compactor (see, e.g., S. Mitra and K. Kim, "X-Compact: An Efficient Response Compaction Technique for Test Cost Reduction", *Proceedings of International Test Conference,* 2002), the I-compactor (see, e.g., J. H. Patel, S. S. Lumetta, S. M. Reddy, "Application of Saluja-Karpovsky compactors to test responses with many unknowns," *Proceedings of VLSI Test Symposium* 2003, pp. 107-112), and the convolutional compactor (see, e.g., J. Rajski, J. Tyszer, C. Tang and S. M. Reddy, "Convolutional Compaction of Test Responses", *Proceedings of International Test Conference,* 2003). Embodiments of these compactors can identify failing scan bits if there is only one failing scan bit in each compaction. Unfortunately, most design errors cause more than one failing scan bit to appear so that heuristics must be used in order to find the best answer from multiple choices. The probability of finding the right answer can be enhanced by using higher Hamming distance compactors. However, such compactors require more hardware and more output pins, and therefore offer lower test compaction.

A second approach is the bypass approach. Typically, test compression designs offer an uncompressed mode of operation in which the circuit operates as a regular scan design without compression. In uncompressed mode, for example, the design may concatenate all scan chains which go to the same compactor into one chain such that all scan cells can be accessed without using the compactor. In operation, after a failure is detected in compressed mode, designs are reconfigured into the uncompressed mode and retested again with uncompressed test patterns which desirably load the same scan cell values as compressed test patterns. Ensuring that both shift operations exist requires some attention to the design. For example, in order to ensure proper shift operation across two scan chains, sometimes, re-timing latches (also known as lock-up latches) are inserted.

Figure 1:
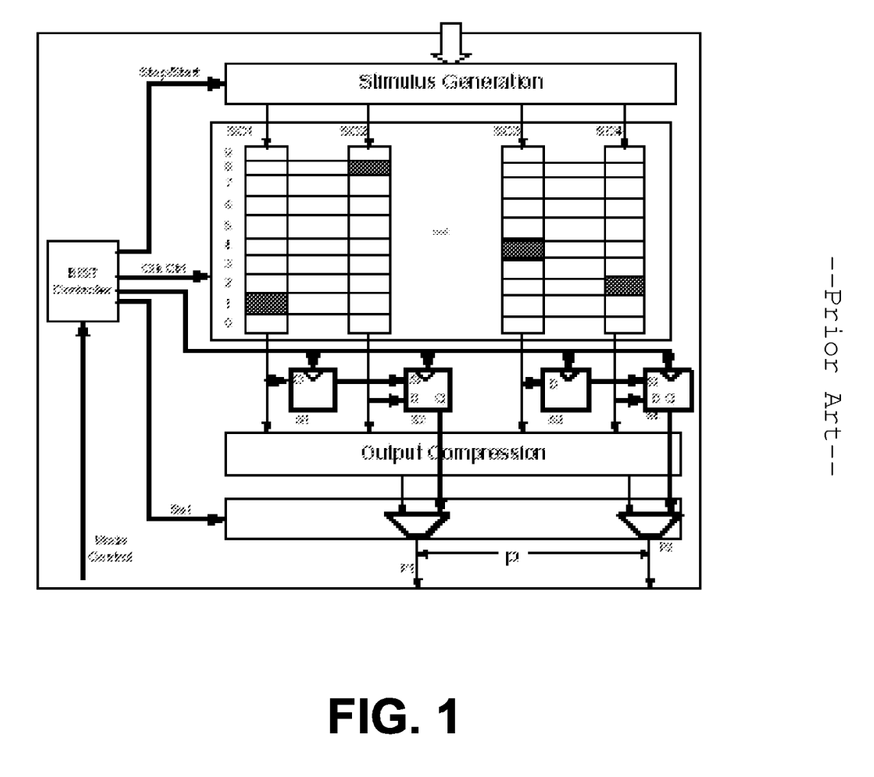
FIG. 1 illustrates a prior art implementation of an integrated circuit device configured to provide individual scan chain outputs in a test compression environment.

A third approach is the hardware approach. In Khoche et al., "Selective and Accurate Fail Data Capture in Compression Environment for Volume Diagnostics," *Proceedings of International Test Conference* 2006, paper 8.1., the modified design shown in FIG. 1 was proposed. In this approach, an extra shift register is inserted to constantly parallel capture the scan output values of all scan chains before they enter the output compactor. Whenever there is a need to observe the values captured in this shift register, a mode called "slice shift" is activated by a single special mode control signal. During slice shift mode, internal shift operations are placed on hold and the data on this special shift register is unloaded through compactor outputs. If the timing is set properly, users can use slice shift mode to identify failing scan bits which contribute to a failure detected at compactor outputs if the compactor has combinational logic only. As mentioned in Khoche et al. and in contrast to the bypass approach, if the ATE can support a match loop properly, slice shift mode can be triggered in real time when the ATE detects a failure such that the failing scan bits can be identified without retesting. However, this real time operation cannot support sequential compactors or pipeline stages inserted either inside the compactor or placed between compactor and output pads. Moreover, this approach requires one extra flip-flop for each internal scan chain and other logic is needed to do slice shifting while holding the internal scan shift.

BRIEF SUMMARY OF THE INVENTION

Disclosed herein are embodiments of a hardware approach that employs a register is to continuously capture the scan output values of all scan chains. Whenever there is a need to observe the values captured in this register, internal shift operations are placed on hold and the data on this register is unloaded. While various embodiments of the invention may provide similar capabilities as the approach described in Khoche et al., implementations of the invention employ much less hardware and are applicable to a wider array of compression designs. In some cases, for instance, as few as two extra gates are needed.

To prevent the compactor from exhibiting reduced observability caused by unknown values, X-masking can be used to ensure the success of test compression. Examples of X-masking hardware are described, for example, in J. Rajski, M. Kassab, N. Mukherjee, N. Tamarapalli, J. Tyszer and J. Qian, "Embedded deterministic test for Low-cost manufacturing", *IEEE Design and Test of Computers,* Vol 20, Issue 5, pp 58-66, September-October, 2003; J. Rajski, J. Tyszer, G. Mrugalski, W.-T. Cheng, N. Mukherjee, and M. Kassab, "X-Press Compactor for 1000× Reduction of Test Data," *Proceedings of International Test Conference,* 2006, pp.

1-10; U.S. Pat. No. 6,557,129; and U.S. Patent Application Publication No. 20070234157, all of which are hereby incorporated herein by reference.

Typically, X-masking registers are added in front of the compactor to remove unknown values. The X-masking registers block out some chains due to unknown values and select other chains to feed the compactor. According to one embodiment of the disclosed technology, existing X-masking capability is used to select one scan cell to observe at a time after a failure is observed at the compactor output. For purposes of this discussion, the failing bit observation mode is termed "bit select" mode.

According to one exemplary embodiment, when the bit select mode signal is activated, the shift clock is turned off to freeze the internal scan cells. Then, the X-masking register is used to select one scan chain at a time to enter the compactor such that the values at all scan chain outputs can be accessed. Desirably, the shift clock is held "off" while the X-masking register clock is "on." As long as the bit select signal can be timed accurately to match the failures detected at the ATE, the scan cells that contributed to the externally detected failures (e.g., all scan cells that contributed to the externally detected failures) can be accessed one at a time. The operation and extra hardware needed will typically vary from implementation to implementation depending the compression design used. In the following sections, exemplary implementations are described for three kinds of popular compactors: space compactors, finite input response compactors, and infinite input response compactors.

These and other features and aspects of the invention will be apparent upon consideration of the following detailed description.

DETAILED DESCRIPTION OF THE INVENTION

Introduction

Disclosed below are representative embodiments of circuit testing techniques and associated apparatus that should not be construed as limiting in any way. Instead, the present disclosure is directed toward all novel and nonobvious features and aspects of the various disclosed methods, apparatus, and equivalents thereof, alone and in various combinations and subcombinations with one another. The disclosed technology is not limited to any specific aspect or feature, or combination thereof, nor do the disclosed methods and apparatus require that any one or more specific advantages be present or problems be solved.

As used in this application, the singular forms "a," "an" and "the" include the plural forms unless the context clearly dictates otherwise. Additionally, the term "includes" means "comprises."

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "determine" and "select" to describe the disclosed methods. These terms are high-level abstractions of the actual operations that are performed. The actual operations that correspond to these terms may vary depending on the particular implementation and are readily discernible by one of ordinary skill in the art.

The disclosed embodiments can be implemented in a wide variety of integrated circuits that use scan-based testing (for example, application-specific integrated circuits (ASICs) (including mixed-signals ASICs), systems-on-a-chip (SoCs), or programmable logic devices (PLDs) such as field programmable gate arrays (FPGAs)). Such integrated circuits can be used in a vast assortment of electronic devices, ranging from portable electronics (such as cell phones, media players, and the like) to larger-scale items (such as computers, control systems, airplanes, automobiles, and the like). All such items comprising integrated circuits with embodiments of the disclosed technology or equivalents are considered to be within the scope of this disclosure.

Any of the apparatus described herein can be designed, verified, and/or simulated using software that comprises computer-executable instructions stored on one or more computer-readable media. Such software can comprise, for example, an electronic design automation (EDA) software tool, such as a design, verification, or simulation tool. Similarly, any of the methods described herein can be performed or simulated (at least in part) using software comprising computer-executable instructions stored on one or more computer-readable media. Furthermore, any intermediate or final results of the disclosed methods or control signals used to perform any of the disclosed methods can be stored on one or more computer-readable media. Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For the same reason, computer hardware is not described in further detail. It should be understood that the disclosed technology is not limited to any specific computer language, program, or computer. For instance, a wide variety of commercially available computer languages, programs, and computers can be used.

Further, any of the disclosed apparatus can be stored as circuit design information on one or more computer-readable media. For example, one or more databases or data structures containing design information (for example, a netlist, HDL file, Oasis file, or GDSII file) can be created (or updated) and stored to include design information for any of the disclosed apparatus. Such databases or data structures can be created (or updated) and stored at a local computer or over a network (for example, by a server computer). Such computer-readable media are considered to be within the scope of the disclosed technologies.

Moreover, any of the disclosed methods can be used in a computer simulation or other EDA environment, wherein test patterns, test responses, and diagnostic results are determined by or otherwise analyzed using representations of circuits, which are stored on one or more computer-readable media. For presentation purposes, however, the present disclosure sometimes refers to a circuit or its circuit components by their physical counterpart (for example, scan cells, registers, logic gates, and other such terms). It should be understood, however, that any reference in the disclosure or the claims to a physical component includes representations of such circuit components as are used in simulation or other such EDA environments.

Space Compactors

For illustrative purposes, the compression scheme used in Embedded Deterministic Test (EDT) is used as an example to describe various embodiments of the invention. Additional details of exemplary EDT compression schemes are described in J. Rajski, M. Kassab, N. Mukherjee, N. Tamarapalli, J. Tyszer and J. Qian, "Embedded deterministic test for Low-cost manufacturing", *IEEE Design and Test of Computers*, Vol 20, Issue 5, pp 58-66, September-October, 2003; and U.S. Pat. No. 6,557,129, both of which are hereby incorporated herein by reference.

Figure 2:
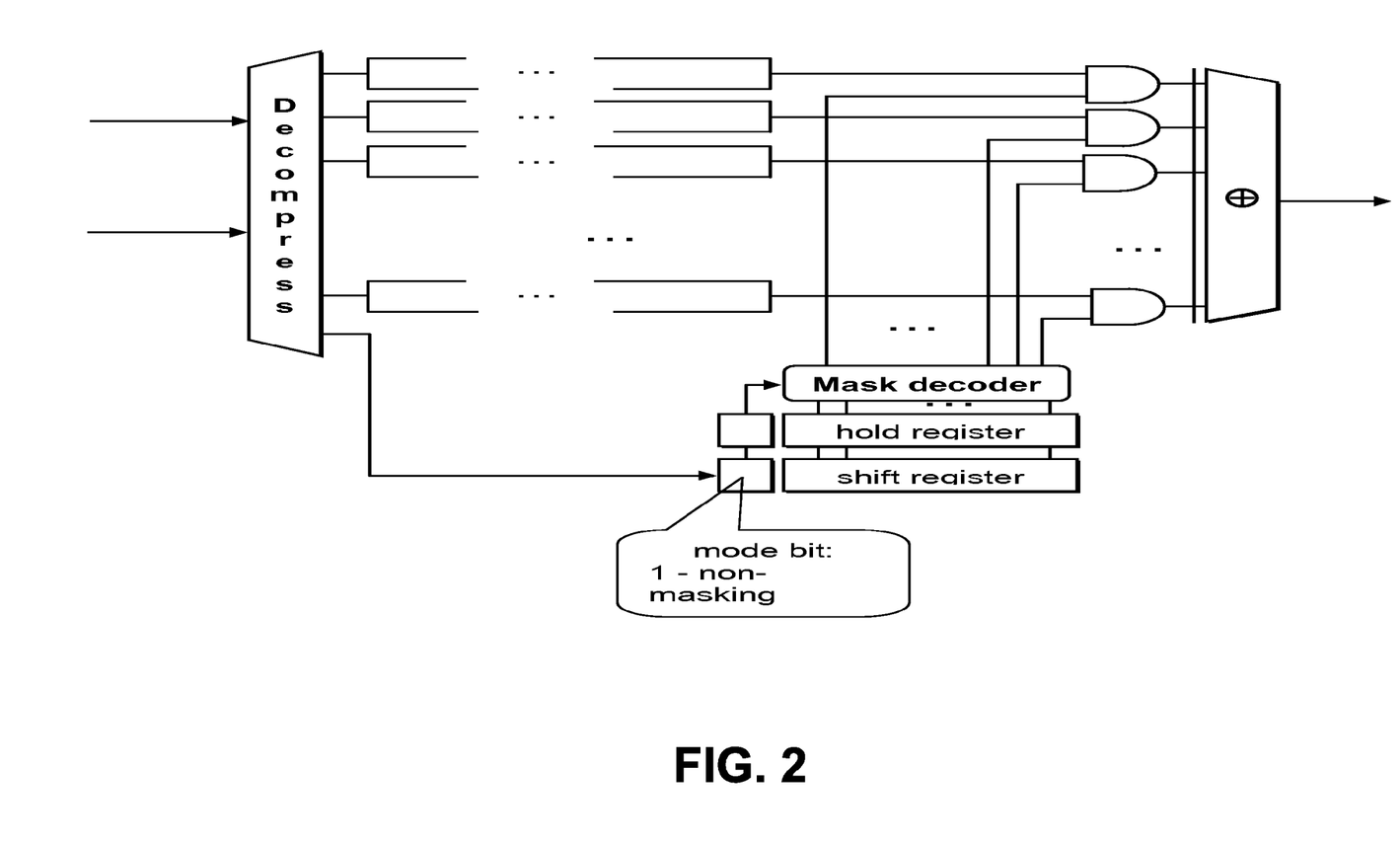
FIG. 2 illustrates an example of an Embedded Deterministic Test (EDT) environment using a space compactor in which various embodiments of the invention may be employed.
Figure 3:
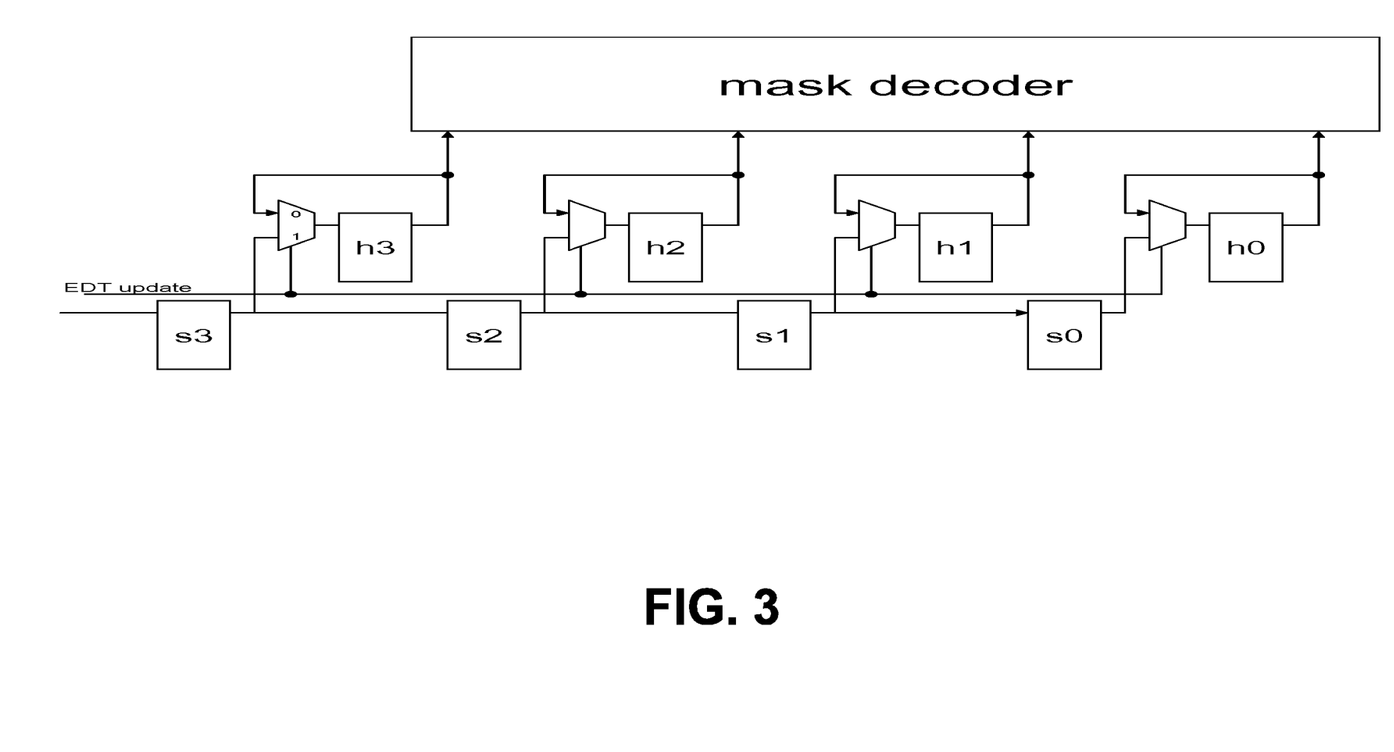
FIG. 3 illustrates FIG. 3 conventional shift and hold registers that may be employed in the EDT environment illustrated in FIG. 2.

An example EDT environment used for purposes of this discussion is illustrated in FIG. 2. In a typical EDT design, the X-masking register can either mask none or mask all but one chain. In other words, it can select either all or only one scan chain to enter the compactor. The masking register typically has (log n+1) bits, where n is the number of scan chains connected to the compactor. For the exemplary design, one mode bit is used to select whether to mask or not. A mask decoder is used to decode a (log n)-bit address to n-bit signals for the scan chains as shown in FIG. 2. Since unloading happens simultaneously with the loading of the next pattern, EDT uses two registers for X-masking. The hold register is used to hold the masking information for the current pattern while it is unloading. Simultaneously, the shift register is ready to receive new masking information for the next pattern. EDT typically uses a space compactor such that when failing data is shifted into the last cell of its respective scan chain, the failure can be detected externally at the same time. According to one exemplary embodiment, at the time the failure is externally observed, the bit select mode signal can be turned on to stop the shift clock. Then, the masking logic is used to observe one scan chain at a time, for n cycles, thereby probing each of the last cells of the scan chains individually through the compression logic output. In order to implement this embodiment, the exemplary EDT hardware can be modified only slightly. For example, one can either modify the shift register or the hold register. FIG. 3 shows the original shift and hold registers before modification.

Figure 4A:
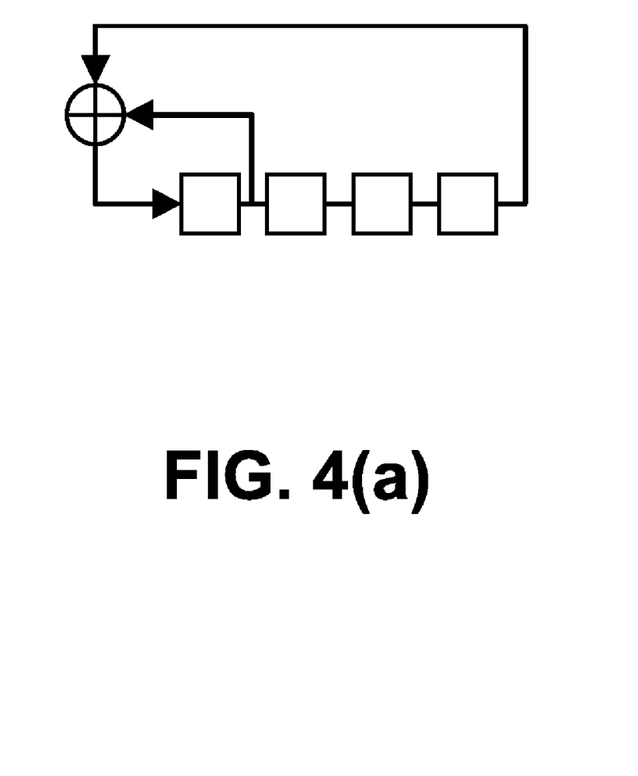
FIGS. 4(a) and 4(b) illustrate modified shift registers that may be employed in the EDT environment illustrated in FIG. 2 according to various embodiments of the invention.

With various embodiments of the invention, the shift register illustrated in FIG. 2 (e.g., a k-bit shift register) can be modified to provide a primitive Linear Feedback State Machine (LFSM) which goes through $2^k-1$ states as shown in FIG. 4(a). It should be noted that an all-0 state is not included in the illustrated LFSM, such that the first chain will not be observed. With information from all other $2^k-1$ chains and the compressed output data, however, the value on the first chain can be derived. As shown in FIG. 3, the state of the shift register moves to the hold register and feeds the decoder to select which scan chain to observe. When the state of the shift register goes through all states, all scan chains are observed individually. In total, and in one exemplary implementation, only two extra gates are needed to accomplish the LFSM in FIG. 4(a): one XOR gate to create the LFSM from the shift register and one more gate to force the mode bit such that the mask information is used.

Figure 4B:
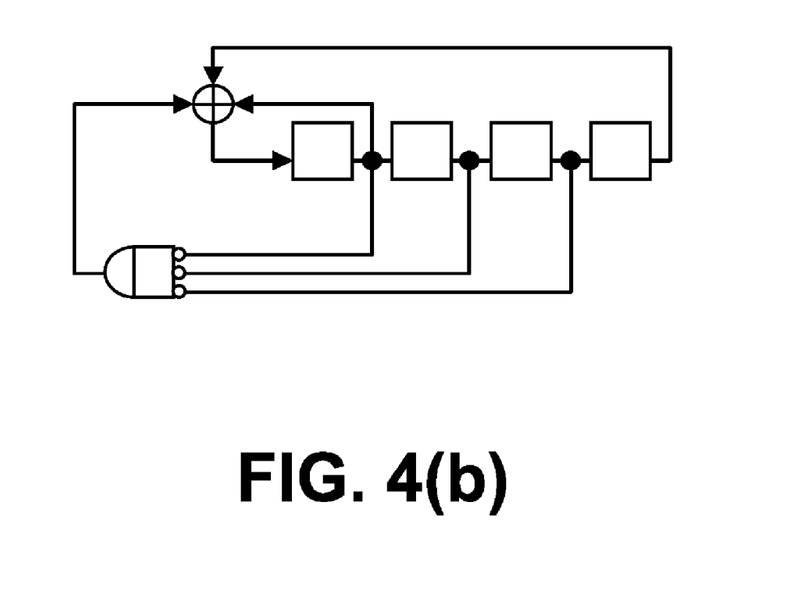

If all-0 and all-1 states are needed to select all scan chains, a simple modification can be made to the feedback circuitry in order to generate all $2^k$ states, including all-0 and all-1 states, as shown in FIG. 4(b). The illustrated LFSM implementation is based on XOR gates, though other logic gates can be used in other implementations (e.g., XNOR gates). In total, and in the illustrated implementation, one more gate is used to accomplish the configuration shown in FIG. 4(b): one XOR and one NOR gate to create the LFSM from the shift register. Since the shift register does not directly control masking, the hold register is desirably updated every cycle from the shift register. Overall, the exemplary embodiment uses one extra cycle for the bit select mode. The value is typically available in the second cycle.

Figure 5:
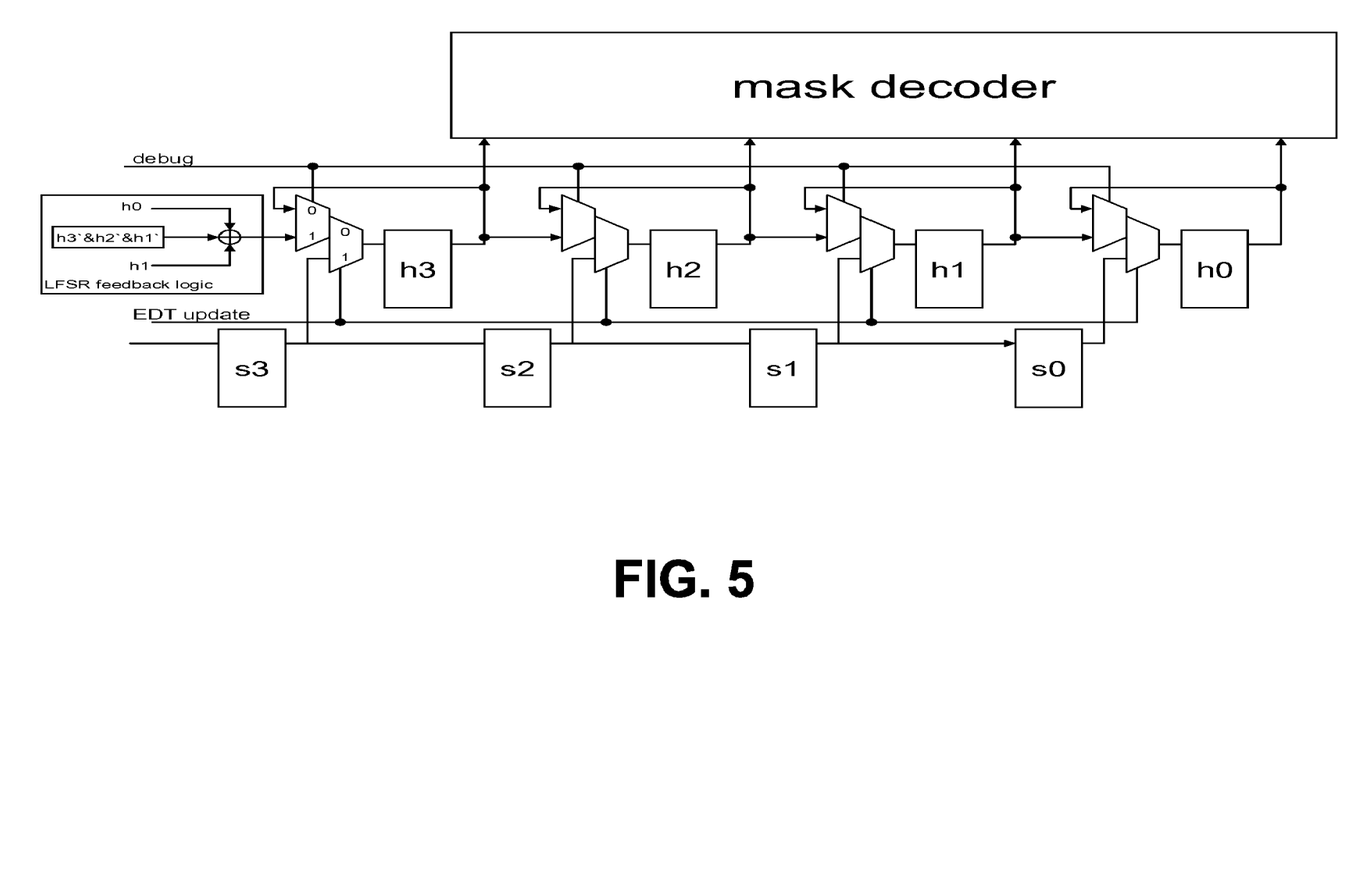
FIG. 5 illustrates a modified hold register that may be employed in the EDT environment illustrated in FIG. 2 according to various embodiments of the invention.

With still other embodiments of the invention, the hold register illustrated in FIG. 3 is converted to be a LFSM. In one exemplary embodiment, for example, the hold register is converted to a shift register, and the 3 gates used for the shift register described in the above and shown in FIGS. 4(a) and 4(b) are added. Further, one extra multiplexer for each hold register bit can be added, as shown in FIG. 5. The advantage of this approach is that it does not require one extra cycle during bit select operation as when the shift register is modified.

A linear masking register has the same number of flip-flops as the number of scan chains to be masked. Its content directly specifies which chains to block and which chains to enter the compactor. To observe all scan chain output values, it is sufficient to modify the linear masking register such that it can have a "walking 1" sequence during the bit select mode. In one exemplary embodiment, the flip-flops (e.g., all flip-flops) are configured to form a shift register which also should have a reset capability. The reset function desirably sets the first flop in the register to "1", which can be later shifted through all the stages while the first flop is fed by constant "0"s.

Finite Input Response Compactors

Various embodiments of the invention can be employed with a so-called "convolutional compactor." Additional details of examples of such convolutional compactors are described in J. Rajski, J. Tyszer, C. Tang and S. M. Reddy, "Convolutional Compaction of Test Responses", *Proceedings of International Test Conference*, 2003; and U.S. Patent Application Publication No. 20040230884, both of which are hereby incorporated herein by reference.

Figure 6:
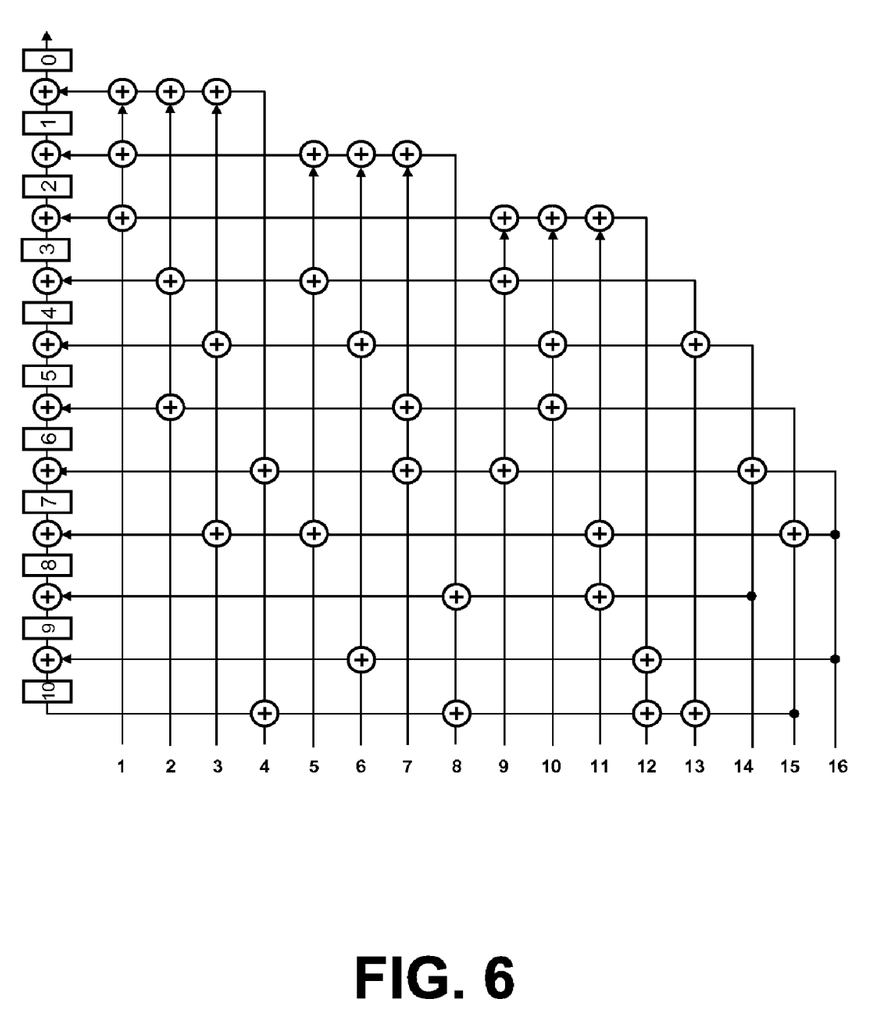
FIG. 6 illustrates an example of a convolutional compactor that may be employed with various embodiments of the invention.

Convolutional compactors typically have a limited memory. Convolutional compactors ordinarily comprise a shift register fed by multiple scan chains via combinational logic containing XOR gates as shown in FIG. 6, which is an example of an 11-bit register driven by 16 scan chains where each scan chain fans-out to 3 stages of the register and where there is only one output. Here, symbol n is used as the length of the shift register and symbol c is used as the number of scan chains. In FIG. 6, n=11 and c=16. After a failing data is detected externally, it is known that the failing scan bits must be from one of the 11 preceding scan cells of the scan chains before the current scan cell values that have reached the scan outputs during the unloading procedure. Therefore, to find out which failing scan bits contributed to the observed external failing data, a maximum of n*c scan cells should be checked during a shift slice mode. To observe these n*c scan cells, and according to one exemplary implementation, n sessions are performed.

Each session observes c scan cell values, which are frozen at the outputs of all scan chains. To uniquely identify these c scan cell values, n+c cycles can be used. In FIG. 6, for example, 27 cycles are used. Table 1 (below) is an example if the selector selects from chain 1 to chain 16 consecutively. If the chain selection sequence is not consecutive, enough information can be obtained from the exemplary compactor embodiment after n+c cycles to uniquely identify c input values as long as each value enters once and they do not enter at the same cycle. Also, at the end of each session, one shift clock is applied to move the next 16 scan cell values to scan outputs. At the first session, the shift register can contain values from previous scan cells which may have unknown failing values. To avoid any confusion, the first session will be extended with n extra cycles for purposes of this discussion such that the data from the first n cycles can be ignored. Therefore, in this example, the total number of cycles used for each bit select mode is n+n*(n+c). This is proportional to the square of n.

TABLE 1

| cycle | scan chain |
|---|---|
| 1 | 1 |
| 2 | 1, 2 |
| 3 | 1, 3 |
| 4 | 4 |
| 5 | 2 |
| 6 | 5 |
| 7 | 2, 3, 6 |
| 8 | 5, 7 |
| 9 | 8 |
| 10 | 3, 4, 6 |
| 11 | 9 |
| 12 | 5, 7, 9, 10 |
| 13 | 7, 11 |
| 14 | 4, 10, 12 |
| 15 | 6, 9, 10 |
| 16 | 8, 13 |
| 17 | 13 |
| 18 | 8, 11, 14 |
| 19 | 11 |
| 20 | 14, 15 |
| 21 | 12 |
| 22 | 12, 14, 15, 16 |
| 23 | 13, 16 |
| 24 | |
| 25 | 15, 16 |
| 26 | |

Infinite Input Response Compactor

With various example of the invention, an On-Product Multiple-Input Signature Register (OPMISR) may be used as the compactor architecture. Additional details of an OPMISR scheme are described in C. Barnhart, V. Brunkhorst, F. Distler, O. Farnsworth, and B. Kellor, "OPMISR: The Foundation of Compressed ATPG Vectors", *Proceedings of International Test Conference*, 2001, which is incorporated entirely herein by reference.

The compaction of the scan outputs using the MISR is observed after each scan pattern. In this example, the number of cycles needed is n+n*(n+c). With a typical Finite Input Response Compactor, after failing data is detected externally, it is known that the failing scan bits must be from the n scan cells before the current scan cell values that have reached the scan outputs. With an Infinite Input Response Compactor, however, the failing scan bits can be from any scan cells. Accordingly, it is desirable to observe k sessions of c cells.

Here, k is the length of the longest scan chain. Therefore, in this example, the total number of cycles is n+k*(n+c). To reduce k, further modifications to the hardware can be made.

Usage Flow

In the case of testers supporting a match loop properly, the bit select mode can be triggered immediately upon an external failure being detected. To accomplish this, the bit select mode control signal should be externally accessible such that ATE can turn it on in real time. Again, this approach is typically used with space compactors without pipeline stages used inside or after compactors.

In certain cases, real time observation will not be possible. In these cases, a retest can be performed. One exemplary approach for performing a retest can be used with any tester and involves one or more of the following method acts:

Record failures detected by original compressed patterns (e.g., all failures detected by original compressed patterns).

Based on the compactor architecture (e.g., combinational, sequential, pipelined), determine the scan cells responsible for the failures.

Determine which cycles these scan cell values will reach the last scan cell of their corresponding scan chains.

Initiate the bit select procedure by activating the bit select mode control signal at the proper cycle and allow enough cycles to observe the values from compactor outputs. The bit select mode control signal can be internal signal such as from JTAG controller.

Validation

To help ensure that the bit select operation is designed correctly, the bit select operation is desirably verified during design rule checking (DRC) before the ATPG run. Also, production test patterns should test the bit select operations to ensure that the added hardware functions correctly in the silicon. For example, one can duplicate current scan chain flush patterns. One set can have no modification and just perform the ordinary chain flush test. The other set can be modified with bit select procedures inserted at each chain flush test pattern. If both set fails, it can be determined that the problem is in the chain flush test. If only the second set fails, it can be determined that the problem is in the bit select operations.

CONCLUSION

Having described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the disclosed technology. Rather, the disclosed technology includes all novel and nonobvious features and aspects of the various disclosed apparatus, methods, systems, and equivalents thereof, alone and in various combinations and subcombinations with one another.

What is claimed is:

1. An integrated circuit device, comprising:
   functional circuitry;
   a plurality of scan chains configured to capture test responses from the functional circuitry and to scan out the test responses;
   a masking circuit configured to block one or more scan chains selected from the plurality of scan chains to mask the test responses, the masking circuit comprising a register that can be converted to, in response to detecting failing data, a linear feedback state machine for selecting the one or more scan chains, the linear feedback state machine comprising one or more exclusive OR gates; and a compactor configured to compact the masked test responses received from the masking circuit.

2. The integrated circuit device of claim 1, wherein the linear feedback state machine is implemented using a modified shift register.

3. The integrated circuit device of claim 1, wherein the linear feedback state machine is implemented using a modified hold register.

4. The integrated circuit device of claim 1, further comprising a bit select module configured to enable the masking circuit to work in a bit select mode.

5. The integrated circuit device of claim 1, further comprising a detection circuit configured to detect failing data from the test responses and to trigger a bit select mode when the failing data is detected.

6. A method of debugging in a test compression environment, the method comprising:

monitoring test responses while the test responses are scanning out and compressed; and switching to a bit select mode in response to detecting failing data in the test responses, wherein the bit select mode comprises:

changing a shift register or a hold register in a masking circuit to work as a linear feedback state machine, the linear feedback state machine comprising one or more exclusive OR gates.

7. The method recited in claim 6, wherein the bit select mode further comprises stopping scanning out the test responses.

* * * * *